United States Patent
Lee

(10) Patent No.: US 9,748,424 B2
(45) Date of Patent: Aug. 29, 2017

(54) SOLAR CELL AND PREPARING METHOD OF THE SAME

(75) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 323 days.

(21) Appl. No.: 14/351,848

(22) PCT Filed: Jun. 19, 2012

(86) PCT No.: PCT/KR2012/004836
§ 371 (c)(1),
(2), (4) Date: Sep. 23, 2014

(87) PCT Pub. No.: WO2013/055005
PCT Pub. Date: Apr. 18, 2013

(65) Prior Publication Data
US 2015/0027525 A1    Jan. 29, 2015

(30) Foreign Application Priority Data

Oct. 13, 2011    (KR) .................. 10-2011-0104741

(51) Int. Cl.
*H01L 31/0463* (2014.01)
*H01L 31/0465* (2014.01)
(Continued)

(52) U.S. Cl.
CPC ...... *H01L 31/0465* (2014.12); *H01L 31/0463* (2014.12); *H01L 31/0749* (2013.01);
(Continued)

(58) Field of Classification Search
None
See application file for complete search history.

(56) References Cited

U.S. PATENT DOCUMENTS 6,388,301 B1 *   5/2002   Tawada ............... H01L 31/0236
                                                           257/436
2007/0163646 A1   7/2007   Kushiya et al.
(Continued)

FOREIGN PATENT DOCUMENTS

CN       1918711 A      2/2007
KR    WO 2010114294 A2 * 10/2010 ......... H01L 31/0749
(Continued)

OTHER PUBLICATIONS

Office Action dated Sep. 29, 2015 in Chinese Application No. 201280054136.X.
(Continued)

*Primary Examiner* — Allison Bourke
*Assistant Examiner* — William E McClain
(74) *Attorney, Agent, or Firm* — Saliwanchik, Lloyd & Eisenschenk

(57) ABSTRACT

A solar cell according to the embodiment includes a back electrode layer on a support substrate; a first through hole dividing the back electrode layer into a plurality of back electrodes; a first contact pattern in the back electrode layer; a light absorbing layer formed on the back electrode layer and including a second contact pattern on the first contact pattern; and a front electrode layer on the light absorbing layer.

8 Claims, 2 Drawing Sheets

(51) Int. Cl.
*H01L 31/0749* (2012.01)
*H01L 31/02* (2006.01)
*H01L 31/0224* (2006.01)

(52) U.S. Cl.
CPC *H01L 31/02008* (2013.01); *H01L 31/022425* (2013.01); *Y02E 10/541* (2013.01); *Y02E 10/542* (2013.01)

(56) References Cited

U.S. PATENT DOCUMENTS

| | | | |
|---|---|---|---|
| 2012/0031459 A1 | 2/2012 | Kim et al. | |
| 2012/0103416 A1* | 5/2012 | Kwon | H01L 31/022425 136/256 |
| 2012/0174957 A1* | 7/2012 | Nishimura | H01L 31/022425 136/244 |
| 2012/0186634 A1* | 7/2012 | Jee | H01L 31/0749 136/252 |
| 2012/0199191 A1 | 8/2012 | Lim | |
| 2012/0291853 A1* | 11/2012 | Lee | H01L 31/022466 136/249 |

FOREIGN PATENT DOCUMENTS

| | | | |
|---|---|---|---|
| KR | 10-2011-0036376 A | 4/2011 | |
| KR | WO 2011046388 A2 * | 4/2011 | ..... H01L 31/022425 |
| KR | 10-2011-0047726 A | 5/2011 | |
| KR | 10-2011-0100489 A | 9/2011 | |
| WO | WO-2010114313 A2 | 10/2010 | |

OTHER PUBLICATIONS

International Search Report in International Application No. PCT/KR2012/004836, filed Jun. 19, 2012.

* cited by examiner

SOLAR CELL AND PREPARING METHOD OF THE SAME

CROSS-REFERENCE TO RELATED APPLICATIONS

This application is the U.S. national stage application of International Patent Application No. PCT/KR2012/004836, filed Jun. 19, 2012, which claims priority to Korean Application No. 10-2011-0104741, filed Oct. 13, 2011, the disclosures of each of which are incorporated herein by reference in their entirety.

TECHNICAL FIELD

The embodiment relates to a solar cell and a preparing method of the same.

BACKGROUND ART

Solar cells may be defined as devices to convert light energy into electrical energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

FIG. 1 shows the structure of a CIGS thin film solar cell according to the related art. In general, the CIGS solar cell can be fabricated by sequentially forming a back electrode layer 20, a light absorbing layer 30, a buffer layer 40 and a front electrode layer 50 on a glass substrate 10. The substrate 10 can be prepared by using various materials, such as soda lime glass, stainless steel and polyimide (PI).

The light absorbing layer 30 is a P type semiconductor layer and mainly includes $CuInSe_2$ or $Cu(InxGa1-x)Se_2$, which is obtained by replacing a part of In with Ga. The light absorbing layer can be formed through various processes, such as an evaporation process, a sputtering process, a selenization process or an electroplating process.

The buffer layer 40 is disposed between the light absorbing layer and the front electrode layer, which represent great difference in lattice coefficient and energy bandgap, to form a superior junction therebetween. The buffer layer 40 mainly includes cadmium sulfide prepared through chemical bath deposition (CBD).

The front electrode layer 60 is an N type semiconductor layer and forms a PN junction with respect to the light absorbing layer 30 together with the buffer layer 40. In addition, since the front electrode layer serves as a transparent electrode at a front surface of the solar cell, the front electrode layer mainly includes aluminum-doped zinc oxide (AZO) having the superior light transmittance and electric conductivity.

Different from a bulk solar cell, the CIGS thin film solar cell includes a plurality of unit cells, which are connected with each other in series through patterning processes (TH1 to TH3). The most important patterning process is the TH2 process. A connection wire 70 makes contact with the back electrode 20 at the TH2 pattern, so electric loss may occur and the efficiency of the solar cell may be significantly degraded if the contact fails at the TH2 pattern.

Meanwhile, referring to FIG. 1, a selenium-molybdenum layer 21 can be formed while the light absorbing layer 30 is being formed on the back electrode 20. In detail, the selenium-molybdenum layer 21 may be formed through the reaction between molybdenum (Mo) of the back electrode and selenium of the light absorbing layer 30. However, the selenium-molybdenum layer 21 may increase the contact resistance between the connection wire 70 and the back electrode 20.

DISCLOSURE OF INVENTION

Technical Problem

The embodiment provides a solar cell capable of improving the photoelectric conversion efficiency by reducing contact resistance and a preparing method of the same.

Solution to Problem

A solar cell according to the embodiment includes a back electrode layer on a support substrate; a first through hole dividing the back electrode layer into a plurality of back electrodes; a first contact pattern in the back electrode layer; a light absorbing layer formed on the back electrode layer and including a second contact pattern on the first contact pattern; and a front electrode layer on the light absorbing layer.

A method of preparing a solar cell according to the embodiment includes the steps of forming a back electrode layer on a support substrate; forming a light absorbing layer on the back electrode layer; forming a second contact layer through the light absorbing layer such that the back electrode layer is partially exposed through the second contact layer; forming a first contact pattern by etching the back electrode layer exposed through the second contact layer; and forming a front electrode layer on the light absorbing layer, the second contact pattern and the first contact pattern.

Advantageous Effects of Invention

The solar cell according to the embodiment includes the first contact pattern in the contact region where the front electrode layer makes contact with the back electrode layer, so a contact area between the front electrode layer and the back electrode layer can be increased. Thus, the electron transfer can be facilitated between the electrodes and the photoelectric conversion efficiency of the solar cell can be improved.

In addition, according to the solar cell of the embodiment, the contact-resistance incremental layer is removed while the first contact pattern is being formed, so the front electrode layer can directly make contact with the back electrode layer. Thus, the contact resistance between the front electrode layer and the back electrode layer can be reduced, so that the photoelectric conversion efficiency of the solar cell can be improved.

MODE FOR THE INVENTION

Figure 1:
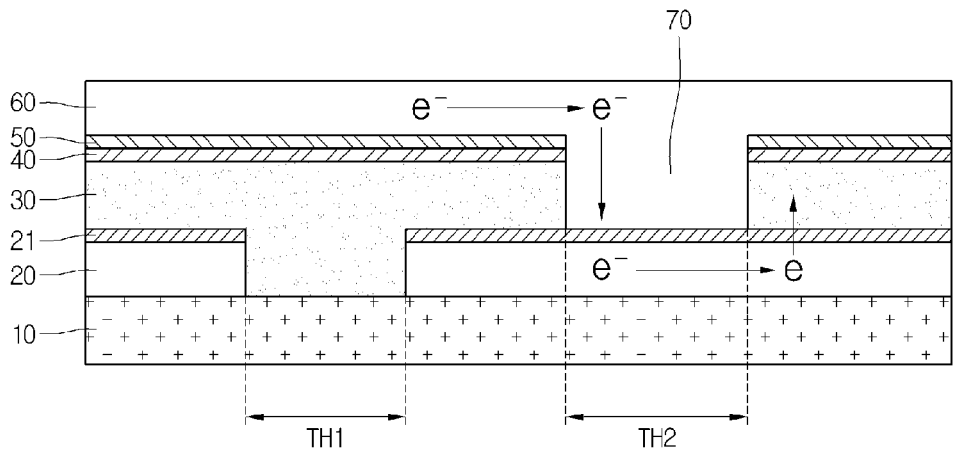
FIG. 1 is a sectional view showing a solar cell according to the related art.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 2:
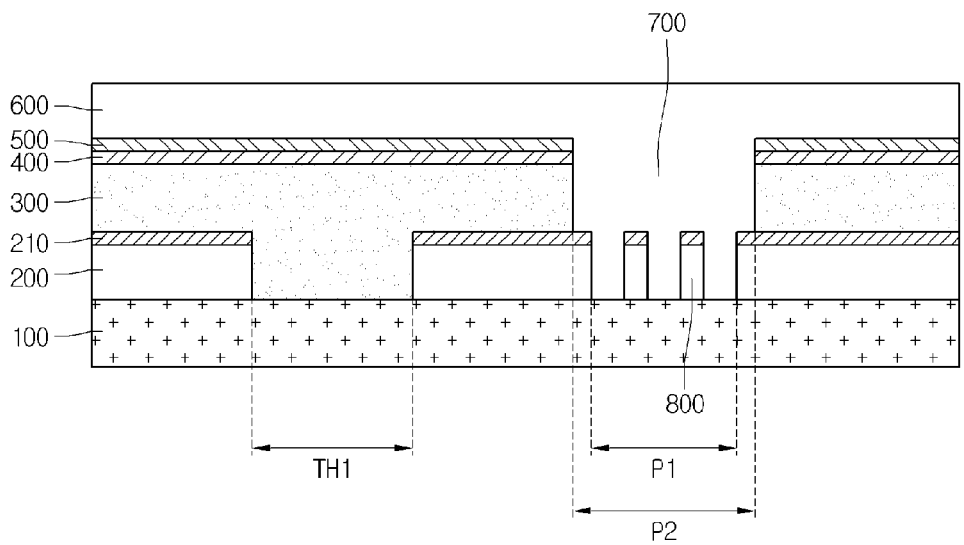
FIG. 2 is a sectional view showing a solar cell according to the embodiment.

FIG. 2 is a sectional view showing a solar cell according to the embodiment. Referring to FIG. 2, the solar cell according to the embodiment includes a support substrate 100, a back electrode layer 200, a contact resistance incremental layer 210, a light absorbing layer 300, a buffer layer 400, a high-resistance buffer layer 500, a front electrode layer 600, a connection wire 700 and contact protrusions 800.

The support substrate 100 has a plate shape and supports the back electrode layer 200, the light absorbing layer 300, the buffer layer 400, the high-resistance buffer layer 500 and the front electrode layer 600. The support substrate 100 may be transparent, and may be rigid or flexible.

In addition, the support substrate 100 may include an insulator. For example, the support substrate 100 may include a glass substrate, a plastic substrate, or a metallic substrate. In more detail, the support substrate 100 may include a soda lime glass substrate. In addition, the support substrate 100 may include a ceramic substrate including alumina, stainless steel, or polymer having a flexible property.

The back electrode layer 200 is provided on the support substrate 100. The back electrode layer 200 is a conductive layer. The back electrode layer 200 may include one selected from the group consisting of molybdenum (Mo), gold (Au), aluminum (Al), chrome (Cr), tungsten (W), and copper (Cu). Among the above materials, the Mo has a thermal expansion coefficient similar to that of the support substrate 100, so the Mo may improve the adhesive property and prevent the back electrode layer 200 from being delaminated from the substrate 100.

The back electrode layer 200 includes first through holes TH1. The back electrode layer 200 can be divided into a plurality of back electrodes by the first through holes TH1. That is, the back electrode layer 200 includes a plurality of back electrodes and first through holes TH1. In addition, the first through holes TH1 can be variously arranged in the form of a stripe as shown in FIG. 2 or a matrix.

The light absorbing layer 300 is provided on the back electrode layer 200. The light absorbing layer 300 includes a group I-III-VI compound. For example, the light absorbing layer 300 may have the CIGSS (Cu(IN,Ga)(Se,S)$_2$) crystal structure, the CISS (Cu(IN)(Se,S)$_2$) crystal structure or the CGSS (Cu(Ga)(Se,S)$_2$) crystal structure.

The contact resistance incremental layer 210 is formed on the back electrode layer. In detail, the contact resistance incremental layer 210 is disposed between the back electrode layer 200 and the light absorbing layer 300. For instance, one side of the contact resistance incremental layer 210 directly makes contact with the back electrode layer 200 and the other side of the contact resistance incremental layer 210 directly makes contact with the absorbing layer 300.

The contact resistance incremental layer 210 can be formed while the light absorbing layer 300 is being formed on the back electrode layer 200. For instance, the contact resistance incremental layer 210 may be formed through the reaction between Mo of the back electrode layer and the Se of the light absorbing layer 300. Thus, the contact resistance incremental layer 210 may include MoSe$_2$ or MoS$_2$.

Due to the contact resistance incremental layer 210, the back electrode layer 200 may not directly make contact with the front electrode layer 600. Thus, the contact resistance between the back electrode layer 200 and the front electrode layer 600 may be increased.

In order to solve the above problem, according to the embodiment, a first contact pattern P1 is formed in the back electrode layer 200. In detail, the first contact pattern P1 is formed in the region that does not overlap with the first through holes TH1. Due to the first contact pattern P1, the contact resistance incremental layer 210 may be partially or completely removed. Therefore, the back electrode layer 200 can directly make contact with the front electrode layer 600, so the contact resistance can be reduced.

In addition, the first contact pattern P1 may increase the contact area between the back electrode layer 200 and the connection wire 700. Thus, the first contact pattern P1 may facilitate the electron transfer among the front electrode layer 600, the connection wire 700 and the back electrode layer 200, so the photoelectric conversion efficiency of the solar cell according to the embodiment can be improved.

The shape of the first contact pattern P1 may not be specially limited if the first contact pattern P1 can increase the contact area between the back electrode layer 200 and the connection wire 700.

For instance, the first contact pattern P1 may include a plurality of contact protrusions 800. The contact protrusions 800 may be spaced apart from each other. In addition, the interval between the contact protrusions 800 is in the range of about 1 μm to about 10 μm, but the embodiment is not limited thereto. Further, each contact protrusion 800 may have an average width in the range of about 1 μm to about 10 μm, but the embodiment is not limited thereto.

The shape of the contact protrusions 800 is not specially limited. For instance, the contact protrusions 800 may be prepared in the form of a dot, a wire, a rod, a tube or a concavo-convex structure. In detail, the contact protrusions 800 may have the rod shape.

In addition, as shown in FIG. 2, the contact protrusions 800 may expose a part of the support substrate 100. That is, as shown in FIG. 2, the first contact pattern P1 can be formed through the back electrode layer 200, but the embodiment is not limited thereto.

A second contact pattern P2 is formed on the first contact pattern P1. In detail, the second contact pattern P2 is formed in the region corresponding to the first contact pattern P1. The second contact pattern P2 is formed in the light absorbing layer 300. That is, the second contact pattern P2 is formed through the light absorbing layer 300.

The buffer layer 400 is provided on the light absorbing layer 300. The buffer layer 400 may include CdS, ZnS, InXSY or InXSeYZn(O, OH). The buffer layer 400 may have the thickness in the range of about 50 nm to about 150 nm and the energy bandgap in the range of about 2.2 eV to about 2.4 eV.

The high-resistance buffer layer 500 is disposed on the buffer layer 400. The high-resistance buffer layer 500 includes i-ZnO, which is not doped with impurities. The high-resistance buffer layer 500 may have the energy bandgap in the range of about 3.1 eV to about 3.3 eV. The high-resistance buffer layer 500 can be omitted.

The front electrode layer 600 may be provided on the light absorbing layer 300. For example, the front electrode layer 600 may directly make contact with the high-resistance buffer layer 500 formed on the light absorbing layer 300.

The front electrode layer 600 may include a transparent conductive material. In addition, the front electrode layer 600 may have the characteristics of an N type semiconductor. In this case, the front electrode layer 600 forms an N type semiconductor with the buffer layer 400 to make a PN junction with the light absorbing layer 300 serving as a P type semiconductor layer. For instance, the front electrode layer 600 may include aluminum-doped zinc oxide (AZO). The front electrode layer 600 may have a thickness in the range of about 100 nm to about 500 nm.

The connection wire 700 may be integrally formed with the front electrode layer 700. In detail, when the transparent conductive material is laminated on the high-resistance buffer layer 500, the transparent conductive material is filled in the first and second patterns P1 and P2, so that the connection wire 700 can be formed. The connection wire 700 electrically connects the back electrode layer 200 with the front electrode layer 600.

FIGS. 3 to 7 are sectional views showing the preparing method of the solar cell according to the embodiment. The above description about the solar cell will be incorporated herein by reference.

Figure 3:
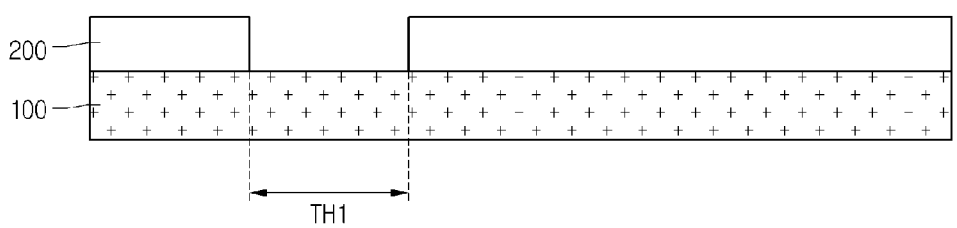
FIGS. 3 to 7 are sectional views showing a preparing method of a solar cell according to the embodiment.

Referring to FIG. 3, the back electrode layer 200 is formed on the support substrate 100. The back electrode layer 200 may be formed through a PVD (Physical Vapor Deposition) scheme or a plating scheme.

The back electrode layer 100 can be formed through the steps of forming a back electrode material on the support substrate and forming a plurality of back electrodes by patterning the back electrode material using the first through holes TH1. For instance, the width of the first through hole TH1 may be in the range of about 80 µm to about 200 µm, but the embodiment is not limited thereto.

Figure 4:
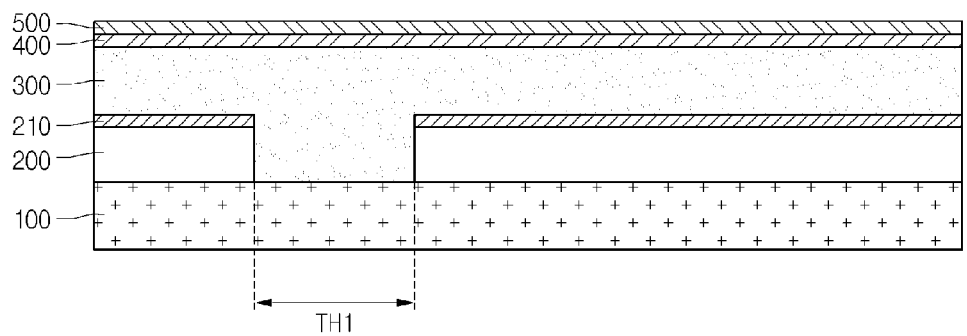

Referring to FIG. 4, the light absorbing layer 300, the buffer layer 400, and the high-resistance buffer layer 500 are formed on the back electrode layer 200.

The light absorbing layer 300 may be formed through various schemes such as a scheme of forming a Cu(In,Ga)Se$_2$ (CIGS) based light absorbing layer 300 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, or a Ga target. Thereafter, the metallic precursor layer is subject to the selenization process so that the Cu (In, Ga)Se$_e$ (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

Thereafter, the buffer layer 400 may be formed by depositing CdS on the light absorbing layer 300 through a CBD (Chemical Bath Deposition) scheme. In addition, ZnO is deposited on the buffering layer 400 through the sputtering process, thereby forming the high-resistance buffer layer 500.

Figure 5:
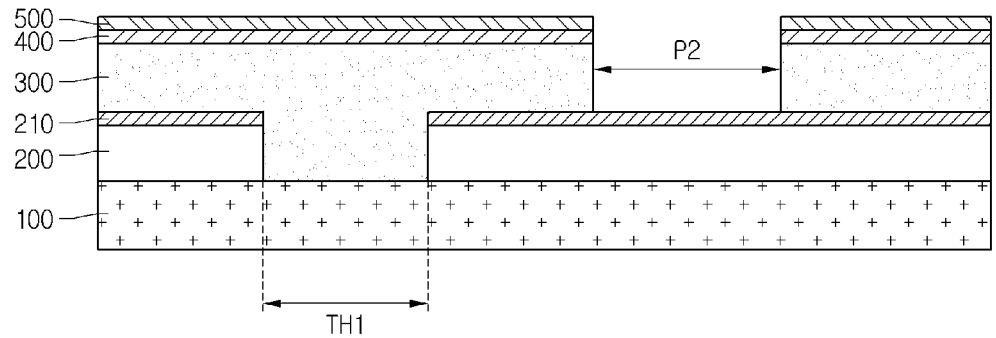

Referring to FIG. 5, the second contact pattern P2 is formed in the light absorbing layer 300, the buffer layer 400, and the high-resistance buffer layer 500. That is, the second contact pattern P2 is formed through the light absorbing layer 300, the buffer layer 400, and the high-resistance buffer layer 500.

The second contact pattern P2 can be formed through the mechanical scheme and has the width in the range of about 80 µm to about 200 µm, but the embodiment is not limited thereto.

Due to the second contact pattern P2, the contact resistance incremental layer 210 is partially or fully exposed. In the case that the contact resistance incremental layer 210 is not formed, the back electrode layer 200 is partially or fully exposed through the second contact pattern P2.

Figure 6:
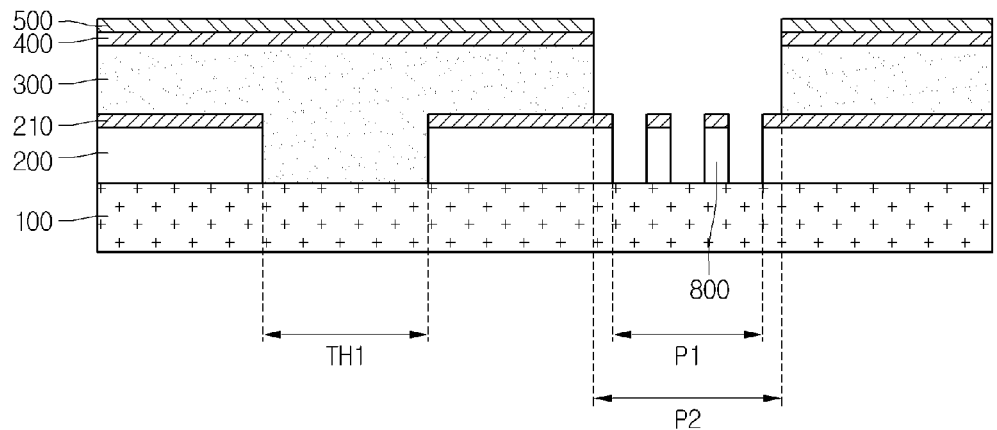

Referring to FIG. 6, the first contact pattern P1 is formed in the back electrode layer 200 and/or the contact resistance incremental layer 210 exposed through the second contact pattern P2.

The first contact pattern P1 can be formed by etching the back electrode layer 200 and/or the contact resistance incremental layer 210 exposed through the second contact pattern P2. Thus, the second contact pattern P2 can be formed in the region corresponding to the first contact pattern P1.

The first contact pattern P1 can be formed through the dry etching, wet etching, mechanical scheme or laser process. For instance, similar to the second contact pattern P2, the first contact pattern P1 can be formed through the mechanical scheme. In addition, the first contact pattern P1 can be formed through the etching process using a mask, but the embodiment is not limited thereto.

The first contact pattern P1 may include a plurality of contact protrusions 800 formed through the etching process. For instance, the contact protrusions 800 are spaced apart from each other at the interval of about 1 µm to about 10 µm, but the embodiment is not limited thereto. Further, each contact protrusion 800 may have an average width in the range of about 1 µm to about 10 µm, but the embodiment is not limited thereto.

Figure 7:
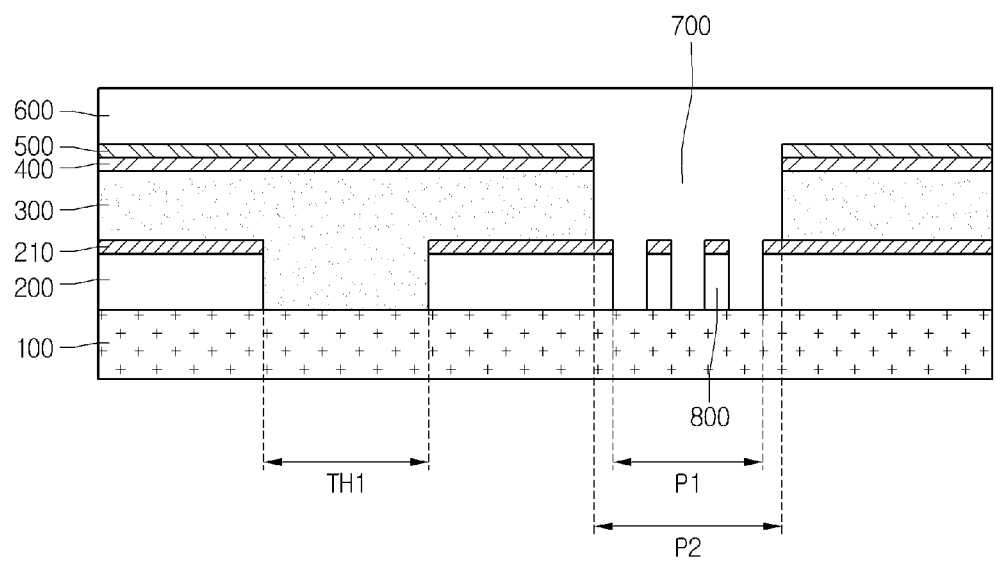

Thereafter, as shown in FIG. 7, a transparent conductive material is laminated on the high-resistance buffer layer 500 and the first and second contact patterns P1 and P2 to form the front electrode layer 600. For instance, the front electrode layer 600 can be formed by performing the RF sputtering process using a ZnO target, the reactive sputtering process using a Zn target or the organic metal chemical deposition process.

In addition, the connection wire 700 is formed when the front electrode layer 600 is formed. That is, when the transparent conductive material is laminated on the high-resistance buffer layer 500, the transparent conductive material is filled in the first and second contact patterns P1 and P2, so that the connection wire 700 is formed. Thus, the connection wire 700 may directly make contact with the first and second contact patterns P1 and P2. Therefore, the connection wire 700 electrically connects the back electrode layer 200 with the front electrode layer 600.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a back electrode layer on a support substrate;
a first through hole dividing the back electrode layer into a plurality of back electrodes;
a first contact pattern in the back electrode layer;
a light absorbing layer formed on the back electrode layer;
a second contact pattern dividing the light absorbing layer into a plurality of light absorbing layers;
wherein the second contact pattern is formed in a region overlapping the first contact pattern;
a front electrode layer on the light absorbing layer;
wherein the first contact pattern includes a plurality of contact protrusions spaced apart from each other,
wherein a portion of a top surface of the support substrate is exposed between each of the plurality of contact protrusions, and
wherein an interval between adjacent contact protrusions of the plurality of contact protrusions is in a range of 1 μm to 10 μm.

2. The solar cell of claim 1, wherein the second contact pattern is formed in a region corresponding to the first contact pattern.

3. The solar cell of claim 1, wherein each contact protrusion is prepared in a form of a dot, a wire, a rod, a tube, or a concavo-convex structure.

4. The solar cell of claim 1, wherein each contact protrusion has a width in a range of 1 μm to 10 μm.

5. The solar cell of claim 1, further comprising a contact resistance incremental layer between the back electrode layer and the light absorbing layer.

6. The solar cell of claim 5, wherein the contact resistance incremental layer includes $MoSe_2$ or $MoS_2$.

7. The solar cell of claim 1, wherein the second contact pattern is formed through the light absorbing layer.

8. The solar cell of claim 5, one side of the contact resistance incremental layer makes contact with the back electrode layer and the other side of the contact resistance incremental layer makes contact with the absorbing layer.

* * * * *